United States Patent
Ochiai et al.

(10) Patent No.: US 12,537,512 B2
(45) Date of Patent: Jan. 27, 2026

(54) FILTER MODULE FOR MULTIPLE CARRIER AGGREGATION WITH GROUND TRACE

(71) Applicant: SKYWORKS SOLUTIONS, INC., Irvine, CA (US)

(72) Inventors: Akira Ochiai, Suita (JP); Kyohei Kobayashi, Otsu (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 455 days.

(21) Appl. No.: 18/149,190

(22) Filed: Jan. 3, 2023

(65) Prior Publication Data

US 2023/0216219 A1 Jul. 6, 2023

Related U.S. Application Data

(60) Provisional application No. 63/266,420, filed on Jan. 5, 2022.

(51) Int. Cl.
*H03H 9/70* (2006.01)
*H03H 9/64* (2006.01)

(52) U.S. Cl.
CPC ............ *H03H 9/70* (2013.01); *H03H 9/6483* (2013.01)

(58) Field of Classification Search
CPC ............... H03H 9/64; H03H 9/70; H03H 9/72
See application file for complete search history.

(56) References Cited

U.S. PATENT DOCUMENTS

| | | | | |
|---|---|---|---|---|
| 7,298,231 B2 * | 11/2007 | Ikuta | ...................... | H03H 9/725 333/133 |
| 7,400,216 B2 * | 7/2008 | Fuse | .................... | H03H 9/6483 333/133 |
| 7,609,129 B2 * | 10/2009 | Yokota | ............... | H03H 9/02952 333/133 |
| 7,733,196 B2 * | 6/2010 | Tsurunari | ............. | H03H 9/0576 333/194 |
| 8,339,217 B2 * | 12/2012 | Kawamoto | ............ | H03H 9/725 333/133 |
| 8,680,944 B2 * | 3/2014 | Ye | .......................... | H03H 9/542 333/133 |
| 9,520,859 B2 * | 12/2016 | Inate | ...................... | H10N 30/01 |
| 9,621,327 B2 * | 4/2017 | Chang | .................. | H04L 5/1469 |
| 9,887,686 B2 * | 2/2018 | Kuwahara | ............ | H03H 9/1085 |
| 11,463,069 B2 * | 10/2022 | Caron | ...................... | H03H 9/25 |

(Continued)

*Primary Examiner* — Andrea Lindgren Baltzell
*Assistant Examiner* — Alan Wong
(74) *Attorney, Agent, or Firm* — Lando & Anastasi, LLP

(57) ABSTRACT

A filter module for multiple carrier aggregation includes a substrate, a first filter and a second filter disposed on a first side of the substrate, and a metallic ground trace substantially bisecting the surface of the substrate into first and second substrate sections, such that the first filter is disposed on the first substrate section and the second filter is disposed on the second substrate section and a method of improving cross isolation in a multiple carrier aggregation filter module including a first filter disposed on a substrate for passing a first LTE band and a second filter disposed on the substrate for passing a second LTE band having a neighboring frequency to the first LTE band, the method including bisecting the substrate with a metallic trace such that the first filter is on a different section of the substrate to the second filter.

21 Claims, 8 Drawing Sheets

(56) References Cited

U.S. PATENT DOCUMENTS

| | | | |
|---|---|---|---|
| 2020/0313645 A1* | 10/2020 | Caron | H03H 9/6483 |
| 2023/0318568 A1* | 10/2023 | Ta | H03H 9/0542 |
| | | | 333/187 |

* cited by examiner

FILTER MODULE FOR MULTIPLE CARRIER AGGREGATION WITH GROUND TRACE

CROSS-REFERENCE TO RELATED APPLICATIONS

This application claims priority under 35 U.S.C. § 119(e) to U.S. Provisional Patent Application Ser. No. 63/266,420, titled "FILTER MODULE FOR MULTIPLE CARRIER AGGREGATION WITH GROUND TRACE," filed Jan. 5, 2022, the entire content of which is incorporated herein by reference for all purposes.

BACKGROUND

Field

Aspects and embodiments disclosed herein relate to filter modules for multiple carrier aggregation (CA), and in particular to miniature filter modules with sufficient cross isolation between CA filter bands.

Description of the Related Technology

In filter modules supporting multiple filters, each of the filters supporting a particular filter band, there is a desire both for reduced size, such that an increased number of filter bands can be supported on a particular filter module, and for increased separation between each band such that interference between filter bands can be reduced or eliminated. This separation, or cross isolation (XISO) can be achieved conventionally by modifying each filter or the filter module.

Where each filter is constructed from multiple individual resonators, connected to define the appropriate filter pass band, a sharper rejection for out of band signals can be provided by increasing the number of resonators. This allows for a more defined band pass and prevents out of band signals from being passed by a particular filter. However, increasing the number of resonators also increases the size of the filters, and this, or increasing the spacing between filters, reduces the number of filters which can be incorporated on a filter module.

SUMMARY

According to one embodiment there is provided a filter module for multiple carrier aggregation. The filter module comprises a substrate having a surface, a first filter disposed on a first side of the substrate, a second filter disposed on the first side of the substrate, and a first metallic ground trace substantially bisecting the surface of the substrate into first and second substrate sections, such that the first filter is disposed on the first substrate section and the second filter is disposed on the second substrate section.

According to a further embodiment a method of improving cross isolation in a multiple carrier aggregation filter module is provided, the filter module comprising a first filter disposed on a substrate for passing a first LTE band and a second filter disposed on the substrate for passing a second LTE band having a neighboring frequency to the first LTE band. The method comprises bisecting the substrate with a metallic trace such that the first filter is on a different section of the substrate to the second filter.

The provision of a ground trace separating the first and second filters on the filter modules allows for greater cross isolation and improved (reduced) coupling between the first and second filters. This means that the filters themselves can have the same number of, or fewer, resonators and more filters can be included in a filter module. Conversely, the filter module can be made smaller compared to a conventional filter module having the same number of filters.

In one example the first metallic ground trace is electrically isolated from each of the first and second filters.

An appreciable improvement can be found when the ground line is connected to an output or input of one or more filters or resonators, however, the benefit is improved when the ground line is not connected to a filter or other circuit component.

In one example the first filter is configured to pass a first LTE band and the second filter is configured to pass a second LTE band.

By providing multiple filters which pass different LTE bands more LTE bands can be processed by the filter module. It is noted that aspects and embodiments disclosed herein can also reduce cross isolation between filters which pass the same band, if they are desired to be isolated. However, the utility of the filter module can be increased be providing filters with two different pass bands, tuned to two different LTE bands.

In one example the first LTE band has a neighboring frequency to the second LTE band.

In one example the first LTE band is band 30 and has a frequency band of 2305 to 2360 MHz and the second LTE band is band 7 and has a frequency band of 2500 to 2690 MHz.

In accordance with various aspects and embodiments disclosed herein providing the ground trace improves cross isolation and allows for filters for LTE bands of close frequencies to be provided on the same filter module, because the separation between the filter bands, and the out of band rejection, is improved.

In one example the filter module includes a first input metallic trace disposed on the first side of the substrate connecting a first input of the filter module to an input of the first filter, and a first output metallic trace disposed on the first side of the substrate connecting a first output of the filter module to an output of the first filter.

The filter module may include a second input metallic trace disposed on the first side of the substrate connecting a second input of the filter module to an input of the second filter, and a second output metallic trace disposed on the first side of the substrate connecting a second output of the filter module to an output of the second filter.

By providing a metallic trace from the filter module to each filter a connection can be made to the module and not to each filter directly. Furthermore, by using a metallic trace, as is also used for the ground trace, the traces can be etched onto the substrate surface all in the same process. This eases the construction of the module, and especially in comparison to the prior art, which includes adding further filters to an already busy filter module. Simply adding a further trace in an etching step, rather than adding a small component to a full module, is a significant advantage.

In one example the filter module also includes a third filter disposed on the first substrate section.

A further filter further increases the utility of the filter module. Furthermore, the metallic ground trace also increases the XISO between the third filter and another filter on the same substrate section. That is, even if the third filter is not separated by a metallic ground trace from another filter, the XISO between the third filter and this other filter will be improved.

In one example the filter module also includes a third input metallic trace disposed on the first side of the substrate connecting a third input of the filter module to an input of the third filter, and a third output metallic trace disposed on the first side of the substrate connecting a third output of the filter module to an output of the third filter.

In a further example third filter is configured to pass a third LTE band.

In a further example the third LTE band has a neighboring frequency to the first or second LTE band.

In a further example the third LTE band is band 53 and has a frequency band of 2483 to 2495 MHz.

In a further example the third filter is disposed on the first substrate section or the second substrate section.

The benefits of having a third filter having a third LTE band in a neighboring frequency are to increase the utility of the filter module. It is noted that it is not necessary to add a further ground line to benefit from the XISO improvements, and the third filter can share a substrate section with another filter module.

In one example the filter further comprises a second metallic ground trace disposed on the first substrate section and configured to substantially bisect the first substrate section into first and third substrate sections.

In one example the third filter is disposed on the third substrate section.

In one example the second metallic ground trace is electrically isolated from the first, second, and third filters.

It is possible to bisect the filter module into multiple sections such that each filter is separated from each other filter by preferably one, however, sometimes more ground traces. This can be implemented where the two filters have particularly close LTE bands to provide yet more utility of the filter module.

In a further example the first metallic ground trace is electrically isolated from the third filter.

In one example the filter frequency module includes a fourth filter disposed on the second substrate section.

Providing a fourth filter further increases the utility of the filter module. Furthermore, the metallic ground trace also increases the XISO between the fourth filter and another filter on the same substrate section. Even if the fourth filter is not separated by a metallic ground trace from another filter, the XISO between the fourth filter and this other filter will be improved.

In one example the filter module also includes a fourth input metallic trace disposed on the first side of the substrate connecting a fourth input of the filter module to an input of the fourth filter, and a fourth output metallic trace disposed on the first side of the substrate connecting a fourth output of the filter module to an output of the fourth filter.

In one example the fourth filter is configured to pass a fourth LTE band.

In one example the fourth LTE band has a neighboring frequency to the first or second LTE band.

In a further example the fourth LTE band is band 66 and has a frequency band of 1710 to 2200 MHz.

In one example the fourth filter is disposed on the first substrate section or the second substrate section.

The benefits of having a fourth filter having a fourth LTE band in a neighboring frequency are to increase the utility of the filter module. It is noted that it is not necessary to add a further ground line to benefit from the XISO improvements, and the fourth filter can share a substrate section with another filter module.

In one example the filter further comprises a third metallic ground trace disposed on the first substrate section and configured to substantially bisect the second substrate section into second and fourth substrate sections.

In one example the fourth filter is disposed on the fourth substrate section.

In one example the third metallic ground trace is electrically isolated from the first, second, third, and fourth filters.

It is possible to bisect the filter module into multiple sections such that each filter is separated from each other filter by preferably one, however, sometimes more ground traces. This can be implemented where the two filters have particularly close LTE bands to provide yet more utility of the filter module.

In one example at least one of the filters comprises at least one acoustic wave resonator. Acoustic wave resonators, such as SAW or BAW resonators are useful for filtering signals, as they use mechanical properties of a substrate to provide a filtering action, which allows for an essentially analog filtering process which in turn allows high selectivity and low distortion. Additionally, they are low cost and highly compact.

In one example at least one of the filters comprises a plurality of acoustic wave resonators arranged in a cascade.

By providing multiple resonators on one filter, the filter can be more selectively tuned to provide a useful filtered output with good out of band rejection. Furthermore, multiple notches and band passes can be provided in one filter.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to a filter module having a plurality of filters for filtering or passing a signal corresponding to at least one LTE band. When constructing a filter module it is desired to reduce the size of the filter module, or include more filters on the filter module. This is contrary to the conditions that facilitate maintaining separation between signals passed by each filter, for example, by utilizing an increased number of components composing the filter or a greater separation between filters. The reduction in size of the filter module can, however, be achieved whilst maintaining or improving signal separation by providing a ground trace or plane physically between one and another filter.

In the foregoing, a number of examples are provided, and in these like numerals refer to similar or the same element in each example, with the exception that the prefix of each number is tied to the figure number. That is, metallic ground trace 211a of FIG. 2A, for example, is similar to the metallic ground trace 811a, of FIG. 8A.

Figure 1:
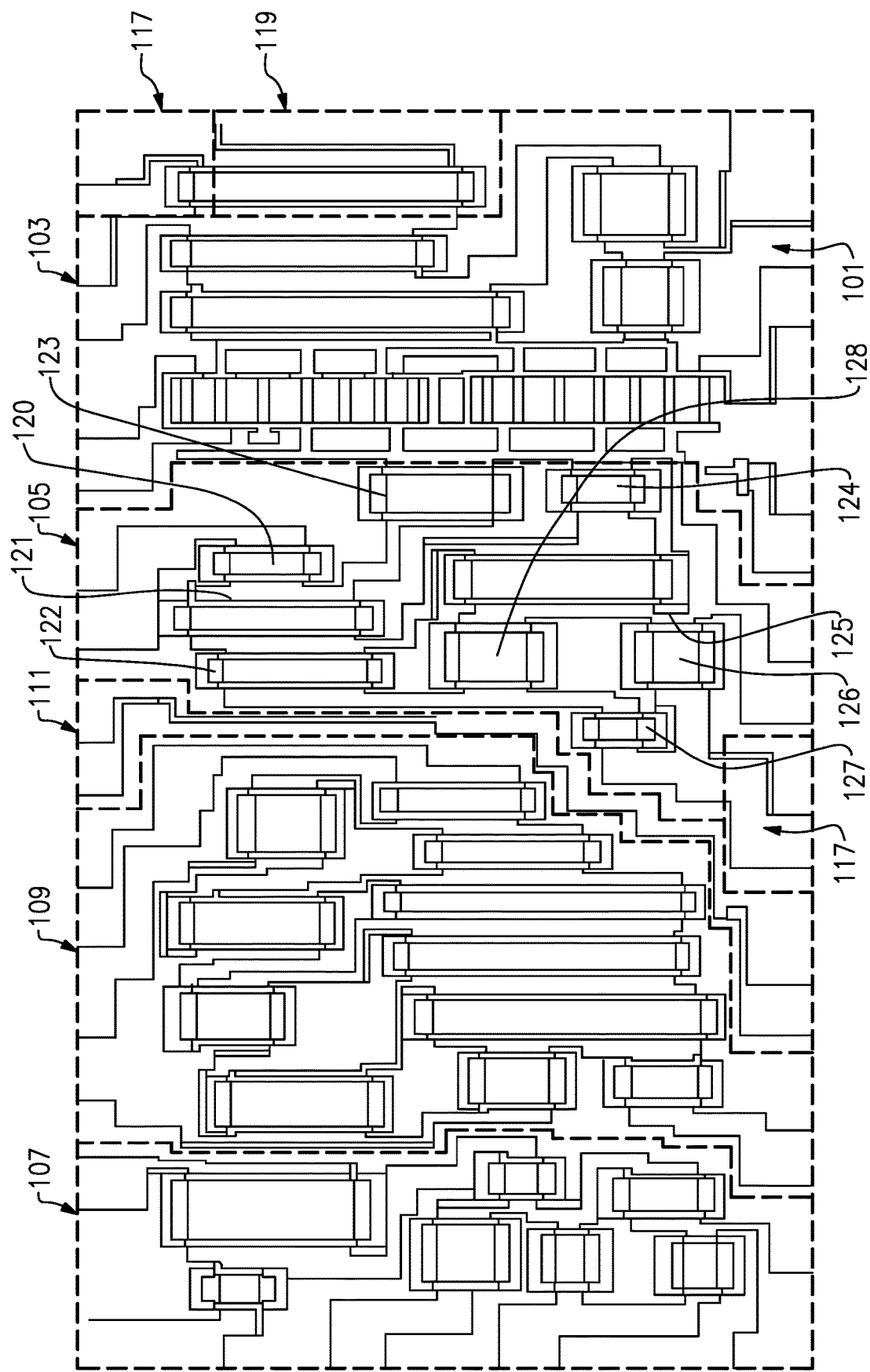
FIG. 1 shows an example filter module according to one embodiment.

FIG. 1 shows an example filter module. The module has various levels of architecture which can readily be seen in the figure. At an abstract level, the filter module has a set of filters, these are denoted as 103, 105, 107, and 109 and are distributed across a substrate 101.

Each filter is formed from multiple individual components, such as acoustic wave resonators. These resonators are set out with reference to the filter 103, as components 120, 121, 122, 123, 124, 125, 126, and 127. Each filter can have as many as eight or more individual resonators.

The individual resonators 120 to 127 and their connections 117 are arranged in a specific manner which entails substantial planning and design to arrange on the substrate 101. For instance, one resonator, e.g., 120 may pass all of the signal of LTE band 55 but may have a large area outside of the LTE band which is also passed due to the nature of the resonator. To deal with this, it may be desired to connect a further resonator, e.g., 121 in parallel or series which clips this out of band area to reduce the out of band signal. This resonator, however, may have a lower signal pass value, i.e., it may only pass signals up to 20 dB, whereas it is desirable for the filter 103 to pass larger signals. A further resonator can then be connected to increase the size of the signal passed. It can be seen that the layout of the resonators is complex and can make adding further resonators difficult.

Each of these resonators takes up space on the substrate 101, and as can be seen, each of the resonators is a different size and shape, and so their arrangement on the substrate 101 is a non-trivial matter. Further still, each resonator is connected to at least one other resonator in either a series, shunt, or parallel configuration, adding yet more complexity to the substrate and taking up yet more room. The different configurations of resonators in each filter provide a challenge to making any changes to the filter layouts on the substrate 101.

For instance, each filter 103, 105 can have any possible arrangements of connections between filters, depending on the required pass band.

The filter module 100 shown in FIG. 1 is a specific example module which can be used in any number of devices to carry out multiple carrier aggregation (CA) filtering. The size of devices which may use the multiple CA filter module is often desired to be reduced, or the space available in the device for the filter module is desired to be reduced. However, as can be seen, the filter module 100 is populated almost to capacity, with very little space between filters on the substrate 101.

Once the filters are arranged on the substrate 101 in such a compact manner, interference between the filters is increased. As each filter, for example, filter 103, has a number of components, e.g., 120, 121, which rely on the use of acoustic propagation to filter signals, physical proximity of the individual filters can cause interference. Furthermore, this interference is increased when the filters are dealing with signals with similar passbands.

For instance, in the specific example of FIG. 1, filter 103 is configured to pass an LTE band 53 signal, which operates at an uplink frequency band of 2483.5 to 2495 MHz. Filter 105 is configured to pass an LTE band 7 signal, which operates at a frequency band of 2500 to 2570 MHz. It can be seen therefore that the pass bands for each filter are separated only by 5 Mhz, and are, in relative terms, very close to each other.

Furthermore, the filter 107 is configured to pass an LTE band 30 having an uplink frequency band of 2305 to 2315 MHz, which while further apart is still relatively close to the pass bands of filters 103 and 105. These bands can be considered to neighbor one another and are at risk of interference.

Filter 109 is configured to pass an LTE band 66 having a frequency range of 1710 to 2200 MHz, which is close to at least the pass band on filter 107. The filter 119 is configured to output an LTE band 25 signal, which has a pass band of 1850 to 1995 MHz, which directly overlaps the pass band of filter 109. The specific arrangement of filters and their pass bands is not limited to this example, and the filters may pass other bands or the same bands but through different filters.

One means of preventing interference is to "clip" the pass bands of the filters, such that the out of band rejection is high. That is to say that very little or no signal is passed by each filter which is strictly outside its designated pass band. This means that there are no signals passed by incorrect filters, i.e., filter 103 does not pass the 2500 MHz signal of filter 105.

To achieve this clipping, it is possible to add more resonators to each filter module. However, as discussed above, there is little space on the substrate 101 for further resonators, and adding further resonators compounds the issue of space. It is therefore a non-trivial exercise to miniaturize and locate resonators and filters on the substrate 101.

As discussed above, the substrate 101 contains multiple connections 117 which facilitate connection between the resonators and the substrate to create the filters. The connections 117 are formed by etching the substrate.

Whilst it can be seen that there is an issue with space on the substrate 101 of the filter module 100, and that attempting to solve this in conventional manners can compound the issue, there is also a further trace 111 on the substrate 101.

The trace 111 is a ground trace, as it is not connected to any potential or signal. The ground trace 111 takes up very little room on the substrate 101. The ground trace 111 achieves separation between the filters in a manner suitable for the filter module size. It is not necessary to use further resonators to achieve the required separation, nor is it necessary to increase the space between the filters to achieve the desired separation.

By providing this separation using the ground trace, the cross isolation between the filters is increased. This means that the filters are substantially more isolated from one another than without the ground trace, and that coupling is improved in the sense that where lower coupling is to be desired, this is achieved.

It is noted that the location of the ground trace 111 is not necessarily important to achieve the separation. The manner by which the signal propagates through the filter module means that the ground trace can achieve the desired cross isolation and coupling improvement in various locations on the substrate, and these locations can be specified based on the particular frequency bands of the filter module 100.

The filter module 100 can be used in any number of devices. The specific example 100 shows a complex and complicated layout of components, which is representative of any number of real-world examples. In other examples, the filter module may have different layouts, however, elegantly the introduction of the ground trace 111 can solve separation problems on any real-world example with no real limit on the exact positioning of either the filters 103, 105, 107, or 109 or the ground trace 111.

To illustrate this, an abstraction of the general principle is set out with reference to the figures below, where the filters are shown in general terms as simple rectangles, so that the various configurations of filters and ground traces can be more readily understood.

Figure 2A:
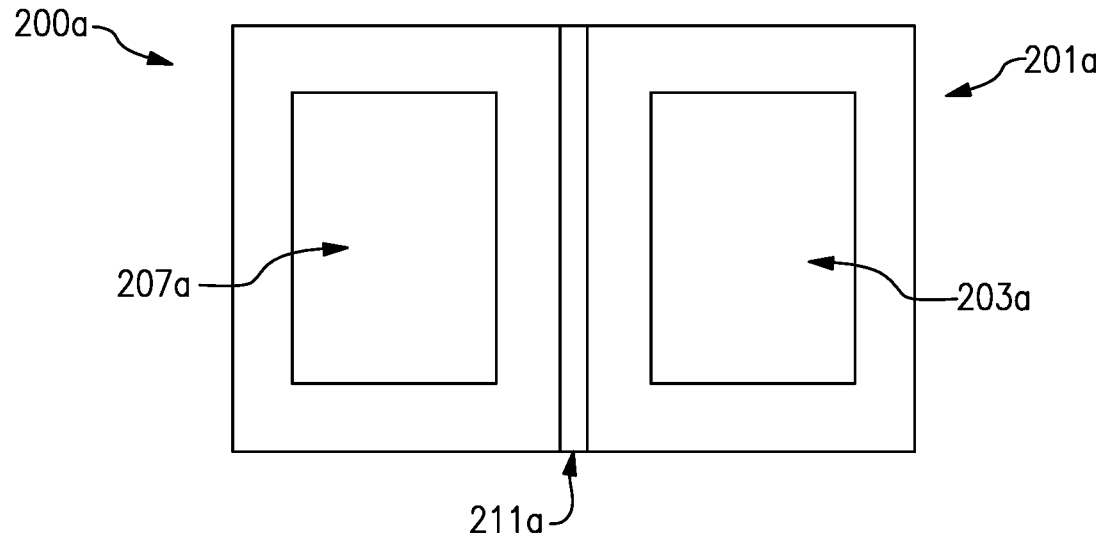
FIG. 2A shows an example filter module according to another embodiment.

FIG. 2A shows an example filter module comprising a substrate 201a, upon which is disposed a first filter 203a and a second filter 207a. Disposed between the first and second filters is a metallic ground trace 211a.

The first filter 203a is tuned to a particular LTE band, such as LTE band 30, which has a frequency band of 2305 to 2360 MHz. In addition, the second filter is also tuned to a particular LTE band such as band 7, which has a frequency band of 2500 to 2690 MHz. It is important therefore that at least the rejection between 2360 MHz in band 30 and 2500 MHz in band 7 is high enough that elements of the band 30 signal are not passed by the second filter 207a.

To achieve this, the ground trace 211a is disposed between the first filter 203a and the second filter 207a. The ground trace increases the cross isolation between the first and second filters. In this sense, the term "ground" trace refers to the fact that the trace is not connected to a voltage potential or to a signal, but operates like the "ground plane" in a convention RF device. The metallic ground trace 211a is also not connected to a filter, however, in some embodiments it may be. The metallic ground trace 211a bisects the substrate into a first section and a second section, and the filter 203a is disposed on the first section and the filter 207a is disposed on the second section.

Figure 3:
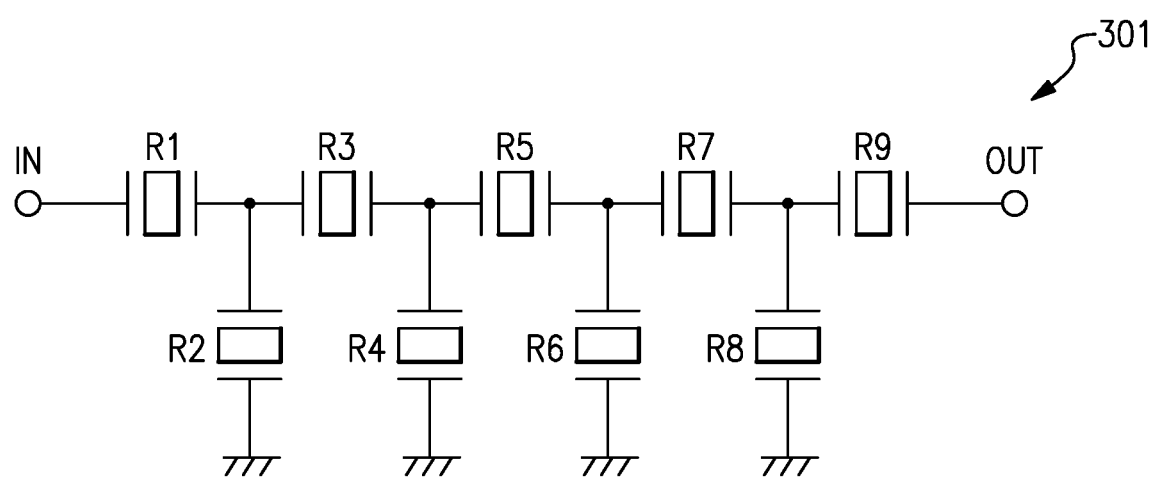
FIG. 3 shows an example filter such as the kind implemented on the filter module of FIG. 1.

The first and second filters 203a and 207a, as shown in FIG. 3, are a combination of acoustic wave devices, which have inputs and outputs as part of their construction. It is possible to utilize the metallic ground trace 211a whilst using these connections to connect a signal to each of the first and second filters.

Figure 2B:
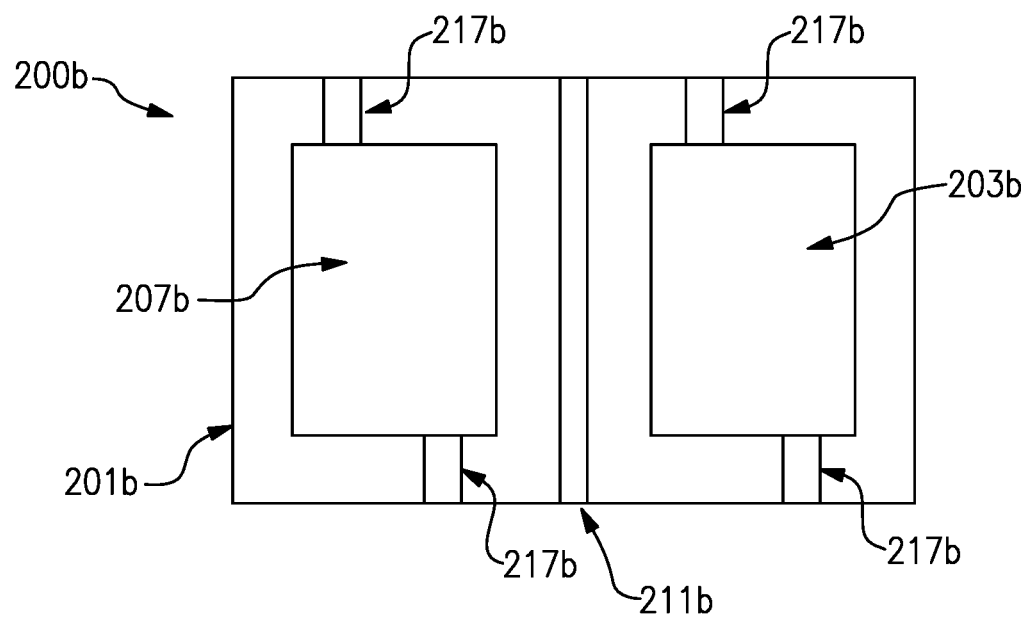
FIG. 2B shows an example filter module according to another embodiment.

As shown in FIG. 2B, the first and second filters 203b and 207b can be connected to the substrate 201b using metallic traces 217b. These are formed in the same way as the metallic ground trace 211b.

The metallic traces of FIGS. 2A and 2B can all be formed in the same manner, for instance, by surface etching a copper coated substrate to leave traces 211a, 211b, and 217b. The metallic traces allow for connections to be made to the substrate and not to each individual filter, which allows for easier connection to the filter module. They are connected between an input on the substrate and an input to a filter, or an output of a filter to an output of the substrate, such that a connection can be made to inputs and outputs on the substrate 201a and not directly to inputs and outputs of the filters. The ground traces 211a and 211b can also be connected to an outside ground plane, or to the ground plane of another filter module.

FIG. 3 shows an example of a filter 301 in which multiple acoustic wave resonators may be combined. FIG. 3 shows an RF ladder filter 301 including a plurality of series acoustic resonators including the resonators R1, R3, R5, R7, and R9, and a plurality of parallel (or shunt) acoustic resonators R2, R4, R6, and R8. As shown, the plurality of series acoustic wave devices R1, R3, R5, R7, and R9 are connected in series between the input and the output of the RF ladder filter, and the plurality of parallel acoustic wave devices R2, R4, R6, and R8 are respectively connected between series acoustic wave devices and ground in a shunt configuration, to create a cascade of acoustic wave resonators. Other filter structures may also be formed and incorporated into the filter modules disclosed herein.

Figure 4:
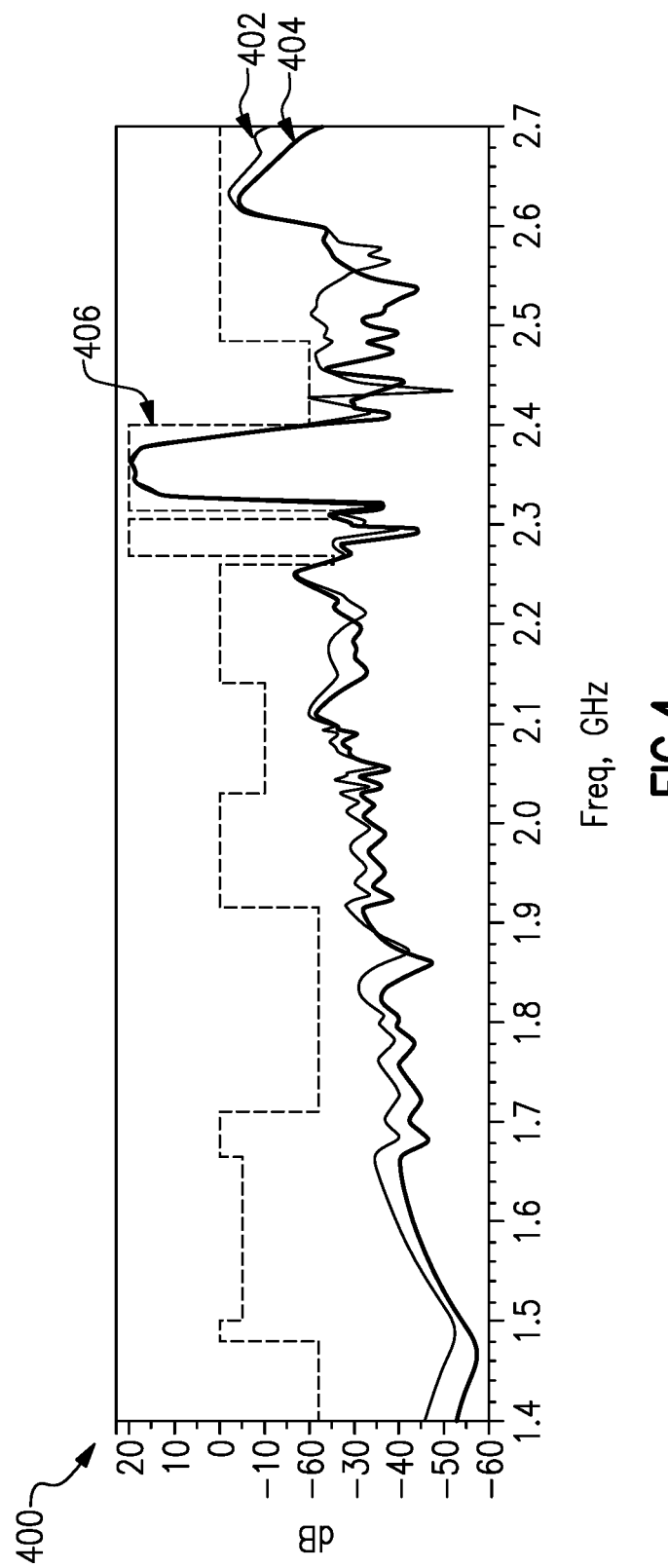
FIG. 4 shows an exemplary response of a filter implemented on the filter module of FIG. 1 compared to a filter implemented on a prior art filter module.

FIG. 4 shows a chart 400 illustrating the response of the filter 203a implemented on the filter module 200a of FIG. 2A compared to a filter implemented on a prior art filter module.

The response of the prior art filter is shown as plot 402 and the response of the filter 203a, or indeed the filter 203b of FIG. 2B is shown as plot 404. The ideal passband for LTE band 30 is also shown as dotted line 406.

It can be seen that the out of band rejection, i.e., the plot where the ideal passband dips below 0 dB, is both on average lower and also smoother in plot 404 than in plot 402. It can also be seen that the prior art plot, 402, touches the ideal passband at some locations to the left of the large spike. This means that that filter comes close to allowing a signal to pass outside the specified pass band. The plot representing the response from the filter 403a implemented on the filter module 400a, does not come close to this band.

Figure 5:
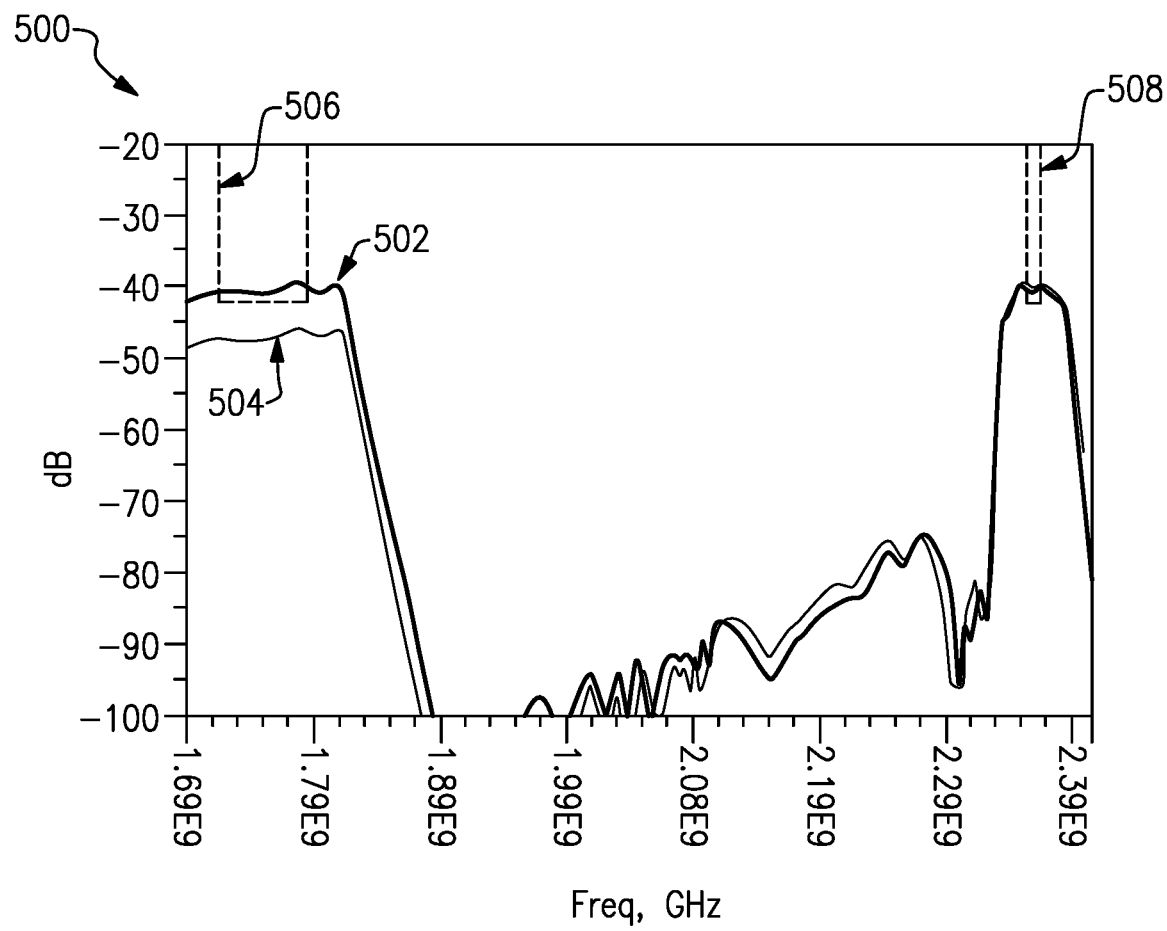
FIG. 5 shows an exemplary noise figure implemented on the filter module of FIG. 1 compared to a filter implemented on a prior art filter module.

FIG. 5 shows plot 500 illustrating an example attenuation between the two signal terminals or filters of the filter module. The y axis shows the attenuation in decibels and the x axis shows the attenuation with respect to frequency. The cross isolation requirement of each signal is shown by the bottom lines of boxes 506 and 508. The bottom line of box 506 shows the required attenuation of a signal for LTE band 66, and the bottom line of box 508 shows the required attenuation of a signal for LTE band 30. The response of the prior art filter module, not having the ground trace, is shown as plot 502. The improved filter module response is shown as plot 504. It can be seen, particularly at 506, that the attenuation is improved using the improved filter module. Attenuation is also improved, in this example to a lesser extent, at 508.

Figure 6:
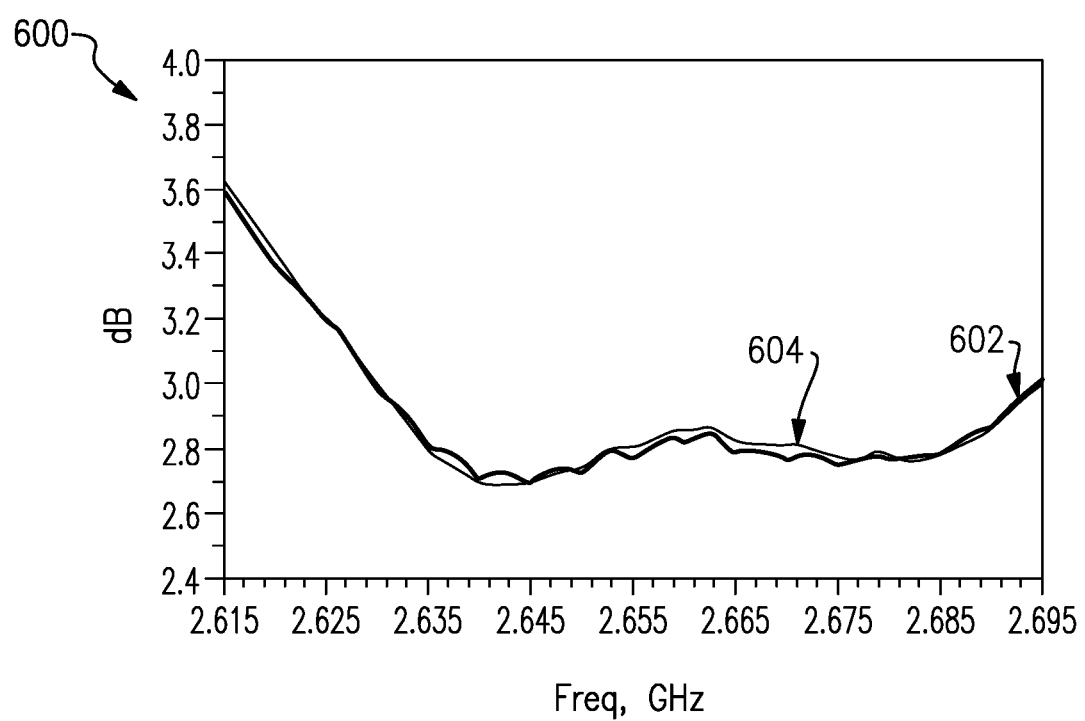
FIG. 6 shows an exemplary noise figure for a filter implemented on the filter module of FIG. 1 compared to a filter implemented on a prior art filter module.

The plot 500 is exemplary, and attenuation is improved across the entire range of LTE bands in various aspects and embodiments disclosed herein. FIG. 6 shows a chart 600 illustrating an example noise figure of a filter 203a implemented on the filter module 200a. In particular, the noise figure shown is for a filter configured to pass LTE band 7, however, the overall improvement shown in the chart 600 is representative of an improvement generally achieved by any filter 203a, or 207a, when implemented on the filter module 200a using the metallic ground trace 211a.

The chart 600 shows a noise figure for a prior art filter module at line 602. The plot 604 shows a noise figure for a filter 203a or 207a when implemented on the filter module 200a having the metallic ground trace 211a. It can be seen that interference is reduced in the filter implemented on the improved filter module 200a, as the noise FIG. 600 is visibly improved. The prior art plot 602 shows a large amount of ripple, which in this example is caused by coupling between the band 7 filter and a band 30 filter on the filter module. This coupling, or interference causes the ripple in the prior art noise figure.

It can be seen however that by providing the metallic ground trace 211a and indeed 211b in FIG. 2B that this ripple is substantially reduced and as such the noise figure is greatly improved. The ripple removed from the noise figure of plot 604 shows that there is lower coupling between the two filters.

Figure 7A:
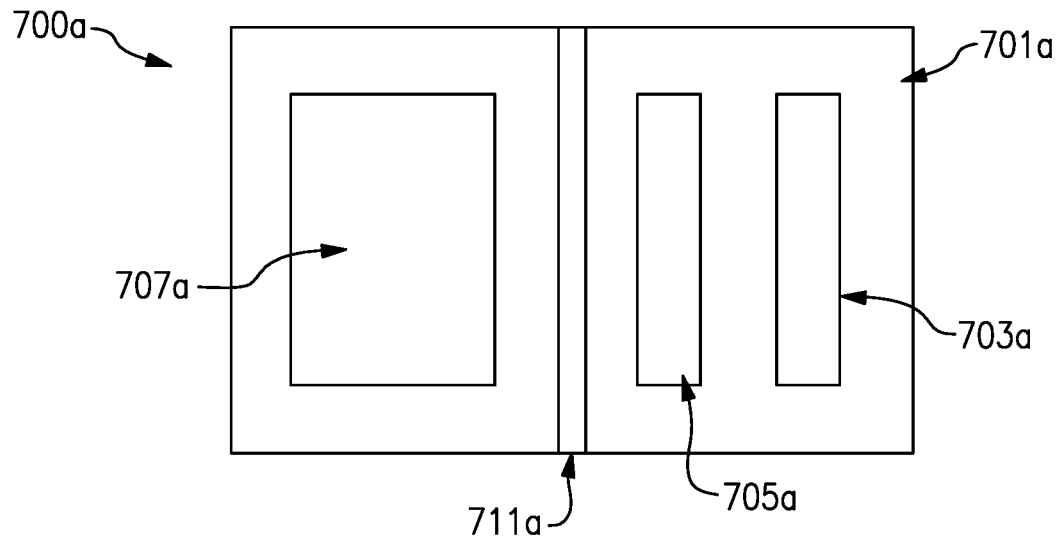
FIG. 7A shows an example filter module according to another embodiment.
Figure 7B:
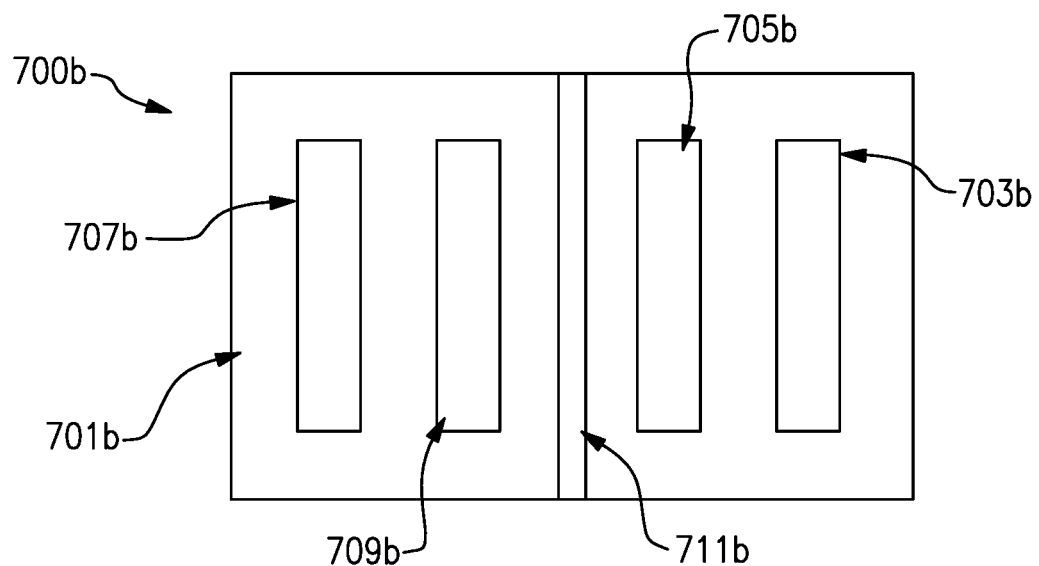
FIG. 7B shows an example filter module according to another embodiment.

FIGS. 7A and 7B show modifications to the filter module 200a and 200b of FIGS. 2A and 2B. In particular, FIG. 7A shows a filter module 700a having a further filter 705a disposed on one side of the bisected substrate 701a. This allows greater capability or utility of the filter module, because more than one LTE band can be passed by the filter module.

FIG. 7B shows yet another filter 709b disposed on the other side of the bisected substrate 701b. Both FIGS. 7A and 7B show the first and second filters 703a, 703b and 707a, 707b, and the metallic ground trace 711a, 711b all disposed on the substrate 701a, 701b. As in FIG. 2B, the filters can be connected to the substrate using metallic traces, not shown, so that the filter module can be provided with all inputs and outputs around the perimeter of the substrate for easy connection.

The third and fourth filters, 705a and 709a are in some instances configured to accept or pass LTE bands 55 and 63. The LTE bands discloses herein are not intended to be limiting, and any filter can pass any of the above or any other LTE bands.

Figure 8A:
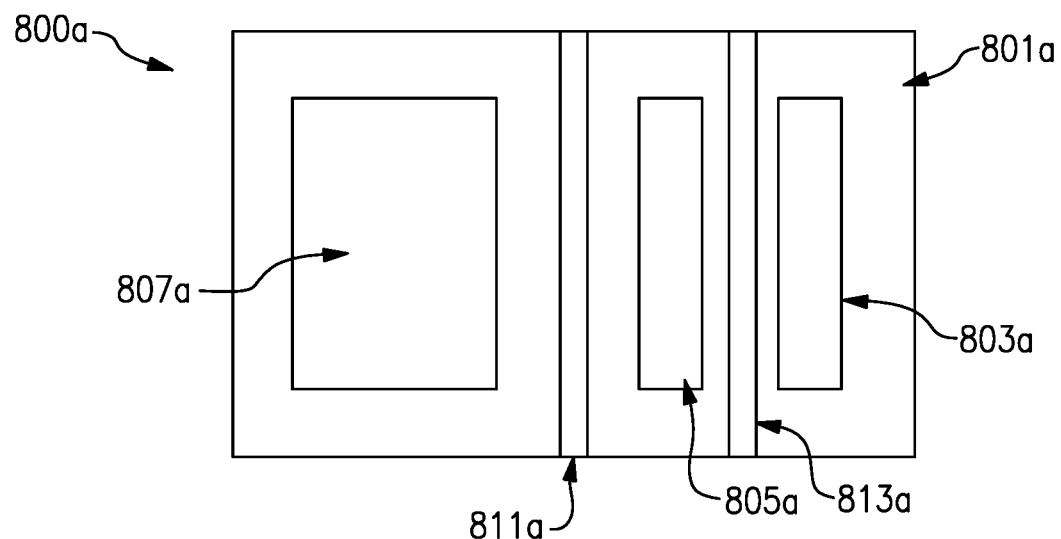
FIG. 8A shows an example filter module according to another embodiment.
Figure 8B:
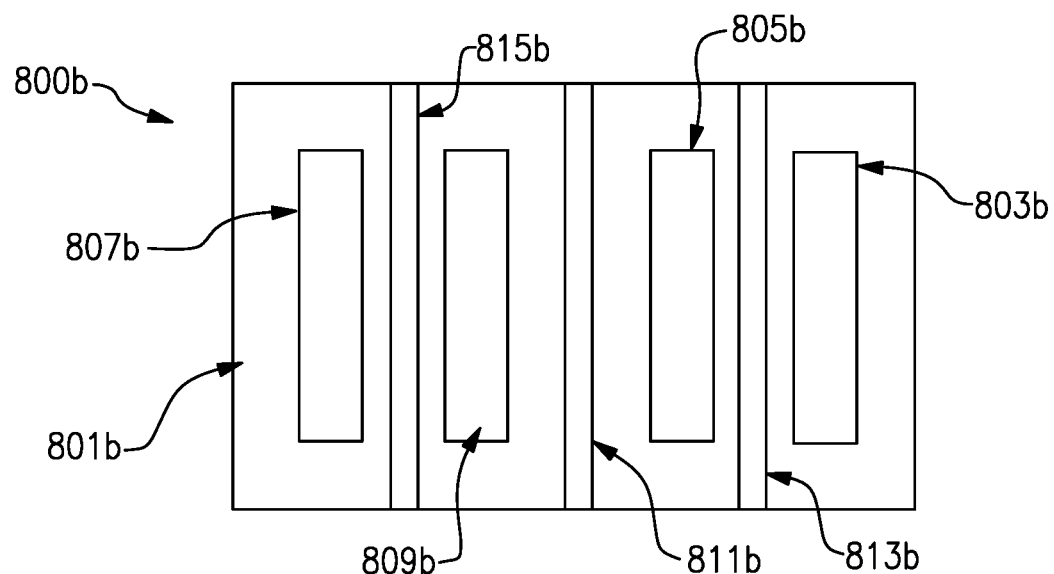
FIG. 8B shows an example filter module according to another embodiment.

FIGS. 8A and 8B show further modifications to the filter modules 200a, 200b, and 700a, 700b which have, in addition to the components of filters 700a and 700b, further metallic ground traces. In particular, FIG. 8A shows a further metallic ground trace 813a. The metallic ground trace 813a bisects a substrate section already provided by the bisection of the substrate 801a by the metallic ground trace 811a. The substrate 801a is then split into three sections with a filter on each section. The example is not limited to one filter per section however, and more filters can be located in each section.

FIG. 8B shows another filter module 800b which has a further metallic ground trace 815b provided on the opposite substrate section, and a further filter 809b disposed on the newly formed substrate section.

The examples of FIGS. 8A and 8B are not limited to the metallic ground traces shown and can be formed with any number of metallic ground traces. These do not have to be located between filters, and filters can be provided without being separated by ground traces.

Examples of the electronic devices that aspects of this disclosure may be implemented include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A filter module for multiple carrier aggregation comprising:
   a substrate having a surface;
   a first filter disposed on a first side of the substrate;
   a second filter disposed on a first side of the substrate; and
   a first metallic ground trace substantially bisecting the surface of the substrate into first and second substrate sections, such that the first filter is disposed on the first substrate section and the second filter is disposed on the second substrate section, the first metallic ground trace extending across an entire width of the surface of the substrate.

2. The filter module of claim 1 wherein the first metallic ground trace is electrically isolated from each of the first and second filters.

3. The filter module of claim 1 further comprising a first input metallic trace disposed on the first side of the substrate connecting a first input of the filter module to an input of the first filter, and a first output metallic trace disposed on the first side of the substrate connecting a first output of the filter module to an output of the first filter.

4. The filter module of claim 3 further comprising a second input metallic trace disposed on the first side of the substrate connecting a second input of the filter module to an input of the second filter, and a second output metallic trace disposed on the first side of the substrate connecting a second output of the filter module to an output of the second filter.

5. The filter module of claim 1 wherein the first filter is configured to pass a first LTE band and the second filter is configured to pass a second LTE band wherein the first LTE band has a neighboring frequency to the second LTE band.

6. The filter module of claim 5 wherein the first LTE band is band 30 and has a frequency band of 2305 to 2360 MHz and wherein the second LTE band is band 7 and has a frequency band of 2500 to 2690 MHz.

7. The filter module of claim 5 further comprising a third filter disposed on one of the first substrate section or the second substrate section.

8. The filter module of claim 7 further comprising a third input metallic trace disposed on the first side of the substrate connecting a third input of the filter module to an input of the third filter, and a third output metallic trace disposed on the first side of the substrate connecting a third output of the filter module to an output of the third filter.

9. The filter module of claim 7 further comprising a second metallic ground trace disposed on the first substrate section and configured to substantially bisect the first substrate section into first and third substrate sections, the second metallic ground trace being electrically isolated from the first, second, and third filters.

10. The filter module of claim 7 wherein the third filter is configured to pass a third LTE band having a neighboring frequency to the first or second LTE band.

11. The filter module of claim 10 wherein the first metallic ground trace is electrically isolated from the third filter.

12. The filter module of claim 10 wherein the third LTE band is band 53 and has a frequency band of 2483 to 2495 MHz.

13. The filter module of claim 10 further comprising a fourth filter configured to pass a fourth LTE band having a neighboring frequency to the first, second, or third LTE band.

14. The filter module of claim 13 further comprising a fourth input metallic trace disposed on the first side of the substrate connecting a fourth input of the filter module to an input of the fourth filter, and a fourth output metallic trace disposed on the first side of the substrate connecting a fourth output of the filter module to an output of the fourth filter.

15. The filter module of claim 13 wherein the fourth LTE band is band 66 and has a frequency band of 1710 to 2200 MHz.

16. The filter module of claim 13 wherein the fourth filter is disposed on one of the first substrate section or the second substrate section.

17. The filter module of claim 13 wherein the first metallic ground trace is electrically isolated from the fourth filter.

18. The filter module of claim 13 further comprising a third metallic ground trace disposed on the first substrate section and configured to substantially bisect the second substrate section into second and fourth substrate sections, the third metallic ground trace being electrically isolated from the first, second, third, and fourth filters.

19. The filter module of claim 1 wherein at least one of the filters comprises at least one acoustic wave resonator.

20. The filter module of claim 19 wherein at least one of the filters comprises a plurality of acoustic wave resonators arranged in a cascade.

21. A method of improving cross isolation in a multiple carrier aggregation filter module, the filter module comprising a first filter disposed on a substrate for passing a first LTE band and a second filter disposed on the substrate for passing a second LTE band having a neighboring frequency to the first LTE band, the method comprising bisecting the substrate with a metallic trace such that the first filter is on a different section of the substrate to the second filter, the metallic trace extending across an entire width of the substrate from a first edge of the substrate to a second edge of the substrate opposing the first edge of the substrate.

* * * * *